(12) United States Patent
Tseng et al.

(10) Patent No.: US 8,713,409 B1
(45) Date of Patent: Apr. 29, 2014

(54) BIT ERROR MITIGATION

(75) Inventors: Chen W. Tseng, Longmont, CO (US);
Weiguang Lu, San Jose, CA (US);
Christopher Y. Karman, Superior, CO (US)

(73) Assignee: Xilinx, Inc., San Jose, CA (US)

( * ) Notice: Subject to any disclaimer, the term of this patent is extended or adjusted under 35 U.S.C. 154(b) by 150 days.

(21) Appl. No.: 13/525,922

(22) Filed: Jun. 18, 2012

(51) Int. Cl.
*G11C 29/00* (2006.01)

(52) U.S. Cl.
USPC .......................................................... 714/768

(58) Field of Classification Search
None
See application file for complete search history.

(56) References Cited

U.S. PATENT DOCUMENTS

| | | |
|---|---|---|
| 6,907,595 B2 | 6/2005 | Curd et al. |
| 7,080,226 B1 | 7/2006 | Patterson |
| 8,099,625 B1 | 1/2012 | Tseng et al. |

OTHER PUBLICATIONS

U.S. Appl. No. 12/950,171, filed Nov. 19, 2010, Rodriguez et al.

*Primary Examiner* — Guerrier Merant
(74) *Attorney, Agent, or Firm* — LeRoy D. Maunu; Lois D. Cartier

(57) ABSTRACT

Approaches for mitigating single event upsets (SEUs) in a circuit arrangement. In response to each bit error of a plurality of bit errors, an error address indicative of the bit error in a configuration memory cell in the circuit arrangement is translated into a non-volatile memory address. A partial bitstream at the non-volatile memory address is read from a non-volatile memory. Successive partial bitstreams read in response to successive ones of the bit errors are alternately transmitted to first and second internal configuration ports. A subset of configuration memory cells of the circuit arrangement, including the configuration memory cell referenced by the error address, is reconfigured with the partial bitstream.

20 Claims, 6 Drawing Sheets

BIT ERROR MITIGATION

FIELD OF THE INVENTION

One or more embodiments generally relate to mitigating bit errors in programmable integrated circuits (ICs).

BACKGROUND

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device ("CPLD"). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Conventionally, three configuration access ports were used for redundancy. With respect to three configuration access ports for programming configuration memory coupled to field programmable logic gates, only one of such ports was active at a time. As only one of such ports is capable of being active at a time in order avoid data corruption or conflicts, voting circuitry was implemented to select which port to use. However, implementation of voting circuitry, as well as having three or more configuration access ports, required a significant amount of overhead.

It should be appreciated that using redundant configuration access ports provides increased reliability to mitigate effects of single event upset ("SEU") or multi-bit upset ("MBU") events. As is known, an SEU or MBU is generally due to radiation from space, such as heavy ion particles or other radiation, causing state of circuitry, such as memory cells, to flip. Below atmosphere, upsets caused by neutron or alpha particles could result in SEU or MBU as well, although at a much lower rate. Accordingly, redundant modules are often employed, especially for high reliability applications as they may not tolerate application downtime. However, as devices become smaller with smaller lithographies, the likelihood of SEU or MBU events may increase, and thus redundant modules may become more prevalent in space as well as terrestrial applications.

As previously indicated, conventionally, a triple module redundancy with voting circuitry was used. Such triple module redundancy was to mitigate effects of SEU or MBU events, and generally involved partial reconfiguration through a configuration interface. By partial reconfiguration, it is generally meant that only a portion of a configuration, such as may be associated with a configuration bit stream, is reloaded or reprogrammed for a repair. Furthermore, such partial reconfiguration may be active or dynamic, meaning that operation of an FPGA is not ceased, and in some embodiments operation of a user instantiated design is not ceased, for such partial reconfiguration. Such conventional SEU or MBU mitigation may employ an external configuration interface, such as a Select Map or JTAG interface, or an internal configuration interface, such as an internal configuration access port ("ICAP"); all of these interfaces are available on FPGAs from Xilinx, Inc., of San Jose, Calif. However, such conventional approaches for detecting and correcting errors involved using a microprocessor or micro-sequencer core, such as a PicoBlaze™ core available from Xilinx, Inc., instantiated in field programmable logic gates of an FPGA for purposes of voting, as previously described. This involved significant overhead.

As is known, Virtex® FPGAs available from Xilinx have built-in detection and correction logic for detecting SEUs and MBUs. For MBUs, correction conventionally involves reloading a portion of a configuration bit stream, namely partial reconfiguration, to correct multiple bits. An SEU, namely in which only one bit is in error, may be corrected with such built-in detection and correction logic by resetting the individual bit.

A limitation of solutions heretofore was having a single point of failure. For example, both external and internal configuration access ports provide access to configuration logic; however, if memory cells in an I/O interface or routing of such interfaces are upset by an SEU or MBU, the ability to access configuration logic, and in particular configuration memory associated with such configuration logic, was precluded. In other words, there was a single point of failure for a selected interface. Even though Virtex® FPGAs available from Xilinx each provide two ICAPs, configuration commands are first sent through an active ICAP in order for an alternative ICAP to subsequently obtain control for writing and reading to configuration memory of configuration logic. Thus if an ICAP currently having control, namely the primary or default ICAP, is upset, the back-up ICAP was rendered useless. Accordingly, the mitigation of such upsets was prohibited by the single point of failure.

SUMMARY

In one embodiment, a method of mitigating single event upsets (SEUs) in a circuit arrangement is provided. The method includes performing operations in response to each bit error of a plurality of bit errors. The operations include translating an error address indicative of the bit error in a configuration memory cell in the circuit arrangement into a non-volatile memory address. A partial bitstream at the non-volatile memory address is read from a non-volatile memory. Each successive partial bitstream is alternately transmitted to one of a first internal configuration port or a second internal configuration port of the circuit arrangement. A subset of configuration memory cells of the circuit arrangement, including the configuration memory cell referenced by the error address, is reconfigured with the partial bitstream.

In another embodiment, a circuit arrangement includes a configuration memory, programmable resources coupled to the configuration memory, a first internal configuration port coupled to the configuration memory, a second internal configuration port coupled to the configuration memory, a memory interface, and a decoder circuit coupled to the first and second internal configuration ports and to the memory interface. The decoder circuit is configured and arranged to, in response to each bit error of a plurality of bit errors, translate an error address indicative of the bit error in a configuration memory cell in the configuration memory into a non-volatile memory address. The decoder reads a partial bitstream via the memory interface at the non-volatile memory address in a non-volatile memory. The decoder also transmits the partial bitstream to one of the first or second internal configuration ports. Successive partial bitstreams, which are read in response to successive ones of the bit errors, are alternately transmitted to the first and second internal configuration ports. Each of the first and second internal configuration ports is configured and arranged to reconfigure a subset of configuration memory cells of the configuration memory, including the configuration memory cell referenced by the error address, in response to a partial bitstream received from the decoder.

A method of mitigating single event upsets (SEUs) in a circuit arrangement is provided in another embodiment. A first decoder is activated and a second decoder is deactivated in the circuit arrangement. In response to the first decoder being active and in response to each bit error of a plurality of bit errors, the first decoder translates an error address indicative of the bit error in a configuration memory cell in the circuit arrangement into a non-volatile memory address. The first decoder further reads a partial bitstream at the non-volatile memory address in a non-volatile memory and transmits the partial bitstream to a first internal configuration port of the circuit arrangement. In response to detecting a threshold number of bit errors in one configuration memory cell, the first decoder is deactivated and a second decoder is activated. In response to the second decoder being active and in response to each bit error of a plurality of bit errors, the second decoder, translates an error address indicative of the bit error in a configuration memory cell in the circuit arrangement into a non-volatile memory address. The second decoder reads a partial bitstream at the non-volatile memory address in the non-volatile memory and transmits the partial bitstream to a second internal configuration port of the circuit arrangement. A subset of configuration memory cells of the circuit arrangement, including the configuration memory cell referenced by the error address, is reconfigured with each partial bitstream.

Other embodiments will be recognized from consideration of the Detailed Description and Claims, which follow.

BRIEF DESCRIPTION OF THE DRAWINGS

Various aspects and advantages of the disclosed embodiments will become apparent upon review of the following detailed description and upon reference to the drawings, in which.

DETAILED DESCRIPTION

The embodiments of the invention provide approaches for mitigating effects of single event upsets (SEUs) in a circuit arrangement. In response to each bit error of a plurality of bit errors, the error address indicative of the bit error is translated into an address in a non-volatile memory. The bit error is associated with a programmable resource in the circuit arrangement. A partial bitstream is read from the non-volatile memory at the computed address. Successive partial bitstreams that are read in response to successive bit errors are alternately transmitted to the first and second internal configuration ports. For each bit error, a subset of programmable resources of the circuit arrangement, including the programmable resource referenced by the error address, is reconfigured with the partial bitstream. By alternating between the first and second internal configuration ports, partial reconfiguration is not prone to a single point of failure through the configuration ports.

Figure 1:
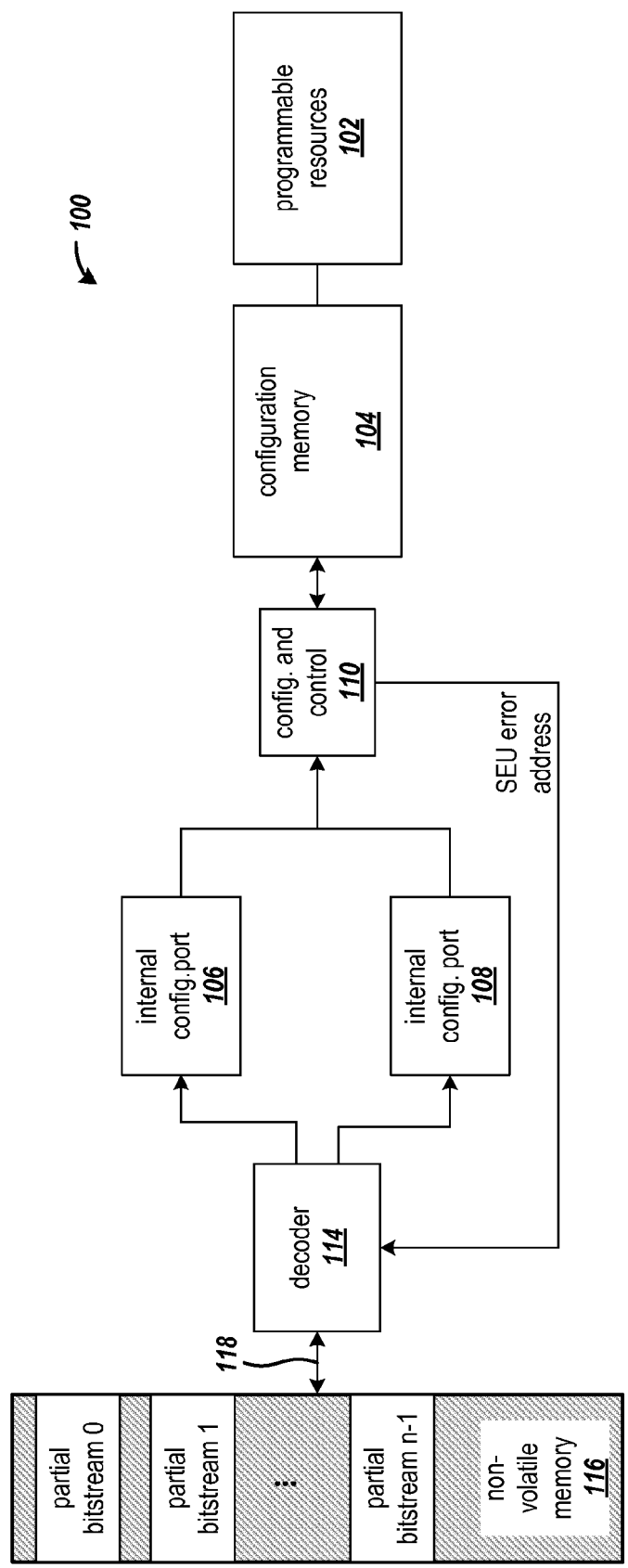
FIG. 1 shows a circuit arrangement for mitigating bit errors.

FIG. 1 shows a circuit arrangement 100 for mitigating bit errors. The circuit arrangement includes programmable resources 102 that are coupled to a configuration memory 104, a configuration and control circuit 110 that is coupled to the configuration memory, and internal configuration ports 106 and 108 that are coupled to the configuration and control circuit. A decoder 114 is coupled to each of the internal configuration ports and to a non-volatile memory 116 via memory interface 118. In one embodiment, the programmable resources 102 and configuration memory 104 are part of a programmable logic integrated circuit such as an FPGA or CPLD. In an alternative embodiment, the configuration memory and programmable resources may be part of any programmable integrated circuit having a memory whose contents dictates the operation of the programmable resource and which is scanned for single event upsets.

The internal configuration ports 106 and 108 are configured to read configuration data from and write configuration data to the configuration memory 104 in response to input control and data. Only one of internal configuration ports 106 and 108 is active for detecting and correcting errors and partially reconfiguring configuration memory 104 as described in U.S. Pat. No. 8,099,625, which is incorporated herein by reference in its entirety.

The configuration and control circuit 110 includes error detection and correction circuitry for detecting and correcting errors in the data stored in the configuration memory 104. The configuration and control circuit 110 scans the configuration memory for bit errors. Correctable bit errors are corrected using ECC codes, for example. For uncorrectable errors, such as multi-bit errors, the address of the error is transmitted as an SEU error address to the decoder 114. Each of the internal configuration ports 106 and 108 is coupled to the decoder 114 with separate data and control lines for receiving configuration bitstreams from the decoder.

The non-volatile memory 116 is configured with n partial bitstreams (designated 0 through (n−1)) for partially reconfiguring the configuration memory 104. Together, the n partial bitstreams comprise a full configuration bitstream for implementing a circuit design in the configuration memory 104 and programmable resources 102. In one embodiment, the non-volatile memory 116 may be implemented as an EEPROM, chalcogenide non-volatile memory, or magnetoresistive random access memory for retaining the stored information when power is removed and may be made to withstand SEUs and multi-bit errors. CRC/ECC data may also be stored in the non-volatile memory. The particular implementation of the non-volatile memory and memory interface 118 may vary according to design requirements.

Each partial bitstream contains control information and configuration data for programming an associated range of addresses in the configuration memory 104. For efficient translation of an SEU error address into the address in the non-volatile memory 116 of the proper one of the n partial bitstreams, the first word of each partial bitstream may be stored at an address that is multiple of a power of 2. Depending on whether or not additional, non-bitstream data is stored in the memory, the base address of the first partial bitstream 0 may be a non-power-of-two address, and the other partial bitstreams would be stored at addresses that are offset from the base address by a multiple of a power of two. If m is the number of words in each partial bitstream (including control words and configuration data), then the address offset of each partial bitstream is a multiple of $2^{ceiling\ (log\ m)}$.

For ease of explanation, the SEU error address is presumed to be the "word" address of the bit for which the error was detected. For partial bitstreams numbered 0 through n−1, the partial bitstream, r, to use for partial reconfiguration may be computed as r=FLOOR (address/m), where address is the SEU error address. The address in the non-volatile memory may then be computed as $r*2^{ceiling\ (log\ m)}$, plus an optional offset.

The size of the partial bitstreams may be chosen according to the minimum quantity of data that can be updated in the configuration memory. For example, in some FPGAs the frame is the smallest addressable segment of the FPGA configuration memory space. Each partial bitstream may contain configuration data for some number of frames. Alternatively, the quantity of data may be based on rows or columns of data, depending on implementation requirements.

In response to receiving an SEU error address from the configuration and control circuit 110, the decoder 114 determines the address in the non-volatile memory 116 of the one of partial bitstreams 0 through n−1 that contains configuration data for reconfiguring the SEU error address. The decoder reads the partial bitstream from the non-volatile memory and provides the partial bitstream to one of the internal configuration ports 106 and 108. The decoder alternates between using internal configuration port 106 and internal configuration port 108 in partially reconfiguring configuration memory 104. For example, the decoder receives an SEU error address from configuration and control circuit 110, reads the proper partial bitstream, and provides the partial bitstream to internal configuration port 106. Upon completion of the correction, the decoder will then access internal configuration port 108 for the next error correction. After the next error has been detected and corrected through internal configuration port 108, decoder 114 will activate internal configuration port 106 for the next correction. Thus, for successive bit errors reported by the internal configuration ports, the decoder alternately transmits the partial bitstreams to the internal configuration ports.

In an alternative embodiment, the decoder 114 may have built-in error detection logic and bypass the configuration and control circuit 110. Instead of receiving an SEU error address from the configuration and control circuit 110, the decoder reads configuration data via one of internal configuration ports 106 or 108 and performs error detection. This provides additional robustness at the cost of most user logic and scan time. The decoder 114 would detect when one or the internal configuration ports 106 has been compromised and switch to the other internal configuration port.

An auto-switch control word in each partial bitstream is used for controlling the activation and deactivation of the internal configuration ports 106 and 108. In response to receiving a partial bitstream with the auto-switch control word, the receiving internal configuration port will assume control as the active internal configuration port and partially reconfigure the configuration memory with the partial bitstream via the configuration and control circuit 110. In response to the next reported bit error, the decoder sends the next partial bitstream to the other internal configuration port, and the auto-switch control word causes that internal configuration port to assume control as the active internal configuration port and partially reconfigure the configuration memory per the partial bitstream.

In one embodiment, the decoder 114, internal configuration ports 106 and 108, configuration and control circuit 110, configuration memory 104 and programmable resources are disposed on the same, single integrated circuit die. In another embodiment, the decoder is off-chip from the internal configuration ports 106 and 108, configuration and control circuit 110, configuration memory 104 and programmable resources. Depending on implementation requirements, the non-volatile memory 116 may be disposed on the same integrated circuit die as the internal configuration ports 106 and 108, configuration memory 104 and programmable resources 102, or the non-volatile memory may be disposed on a separate die.

Figure 2:
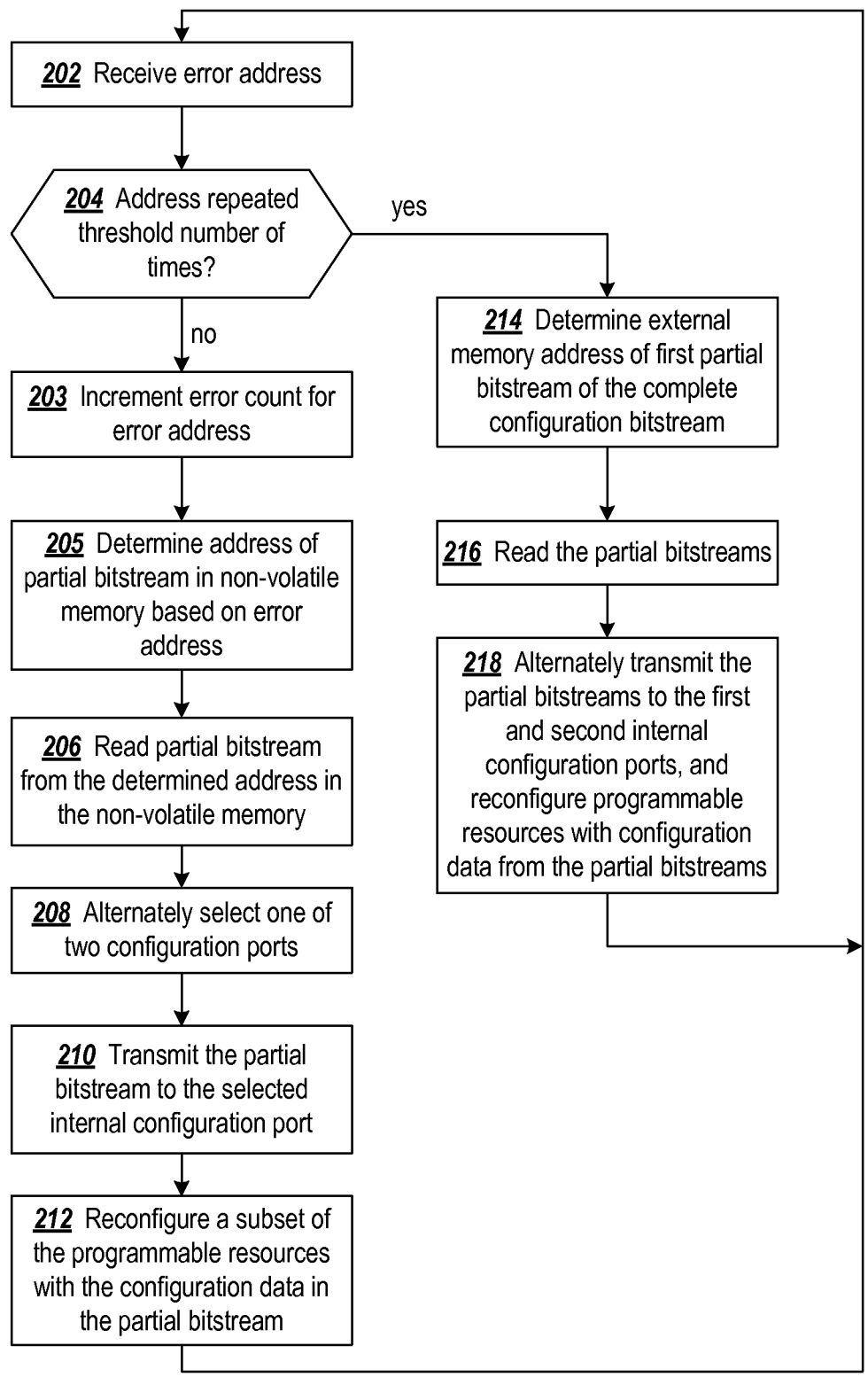
FIG. 2 is a flowchart of a process for mitigating bit errors in accordance with the circuit arrangement of FIG. 1.

FIG. 2 is a flowchart of a process for mitigating bit errors in accordance with the circuit arrangement of FIG. 1. At block 202 an error address that indicates the address in configuration memory 104 of a bit error is received by the decoder 114.

In one embodiment, if a bit error is repeatedly detected for the same address, the process performs a full reconfiguration rather than a partial reconfiguration. Decision block 204 checks whether the error address has been repeated a threshold number of times. The threshold number of times may be selected according to application requirements.

If the threshold number has not been reached, an error count is incremented for the error address at block 203 and error address counts for other addresses are reset. The address in the non-volatile memory of the partial bitstream is determined at block 205. As explained above, the address in non-volatile memory is computed based on the error address and size of the partial bitstreams. At block 206, the partial bitstream is read from the non-volatile memory.

The decoder selects the internal configuration port to which to send the partial bitstream at block 208. As explained above, the decoder alternates between first and second internal configuration ports for partially reconfiguring the configuration memory. In response to receiving the error address from one internal configuration port, the decoder selects the other internal configuration port for performing partial reconfiguration. The partial bitstream is transmitted from the decoder to the selected internal configuration port at block 210, and the configuration memory is updated with the partial bitstream at block 212 to reconfigure a subset of the programmable resources.

Returning now to decision block 204, if the same error address has been reported the threshold number of times, the process is directed to block 214 to begin a full reconfiguration of the configuration memory and programmable resources. At block 214, the process determines the address in non-volatile memory of the first partial bitstream (partial bitstream 0). Beginning with the first partial bitstream, all the partial bitstreams are read from the non-volatile memory at block 216. Though not shown, it will be appreciated that the addresses of the partial bitstreams that follow the first partial bitstream are computed as described above. At block 218, the process alternately transmits the partial bitstreams to the first and second internal configuration ports for updating the configuration memory and reconfiguring the programmable resources.

Figure 3:
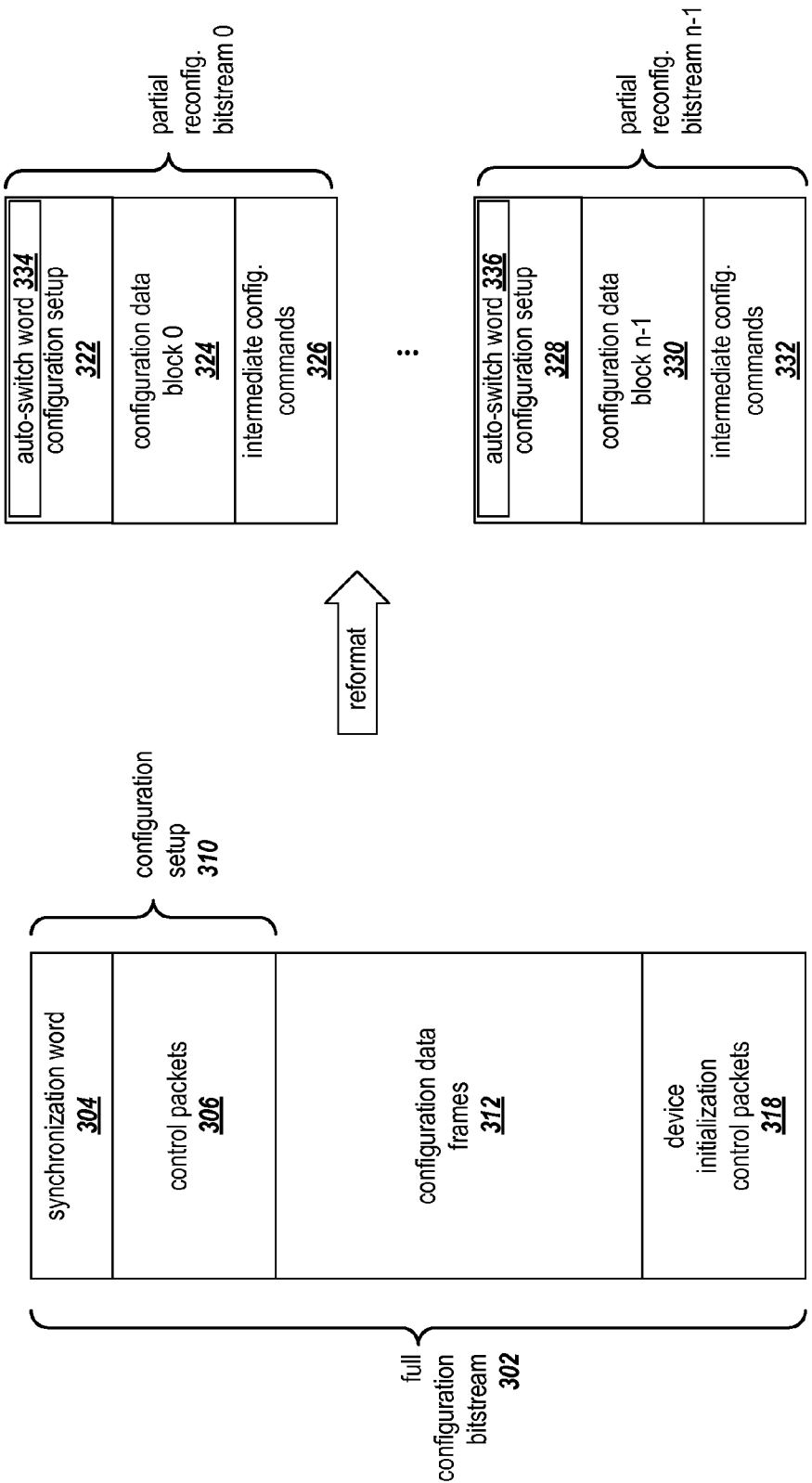
FIG. 3 is a block diagram that shows a transformation of a full configuration bitstream into a plurality of partial configuration bitstreams.

FIG. 3 is a block diagram that shows a transformation of a full configuration bitstream into a plurality of partial configuration bitstreams. In order to quickly perform a partial reconfiguration, the full configuration bitstream 302 is divided into multiple partial bitstreams 0 through n−1.

The full configuration bitstream generally includes three segments of data. The segments include configuration setup information 310, configuration data frames 312, and device initialization control packets 318. The configuration setup information 310 includes a synchronization word 304 and control packets 306. The synchronization word signals the receiving internal configuration port that the data that follows is valid, and the control packets are used to configure the internal configuration port to accept data.

The configuration data frames 312 include data to be stored in configuration memory cells and block RAM cells of the target circuit. Block RAMs are dedicated memory circuits in some FPGAs, for example. The device initialization control packets 318 include information for starting the circuit once configuration is complete.

In dividing the full configuration bitstream 302 into n partial bitstreams, the configuration data block in each of the partial bitstreams stores a subset of the configuration data frames 312. For example, if each block stores m frames of configuration data, then block 0 stores frames 0 through m−1, block 1 stores frames m through 2m−1, block 2 stores frames 2m through 3m−1 etc.

Each of partial bitstreams 0 through n−1 includes a respective set of configuration setup data (e.g., 322 and 328) and a respective set of configuration data (e.g., 324 and 330). Auto-switch control words are added to the configuration setup portions of the partial bitstreams. For example, auto-switch control word 334 is added to partial bitstream 0, and auto-switch control word 336 is added to partial bitstream n−1. As described above, the internal configuration port receiving the partial bitstream with the auto-switch control word is activated for partially reconfiguring the configuration memory, and signaling the other internal configuration port to deactivate.

The intermediate configuration commands 326 and 332 in partial configuration bitstreams 0 through n−1 may include dummy data or designer-specified data. In one embodiment, the intermediate configuration commands may be specified as input to a program executing on a computer processor, which also allows the user to divide the full configuration bitstream 302 into the desired size partial reconfiguration bitstreams.

Figure 4:
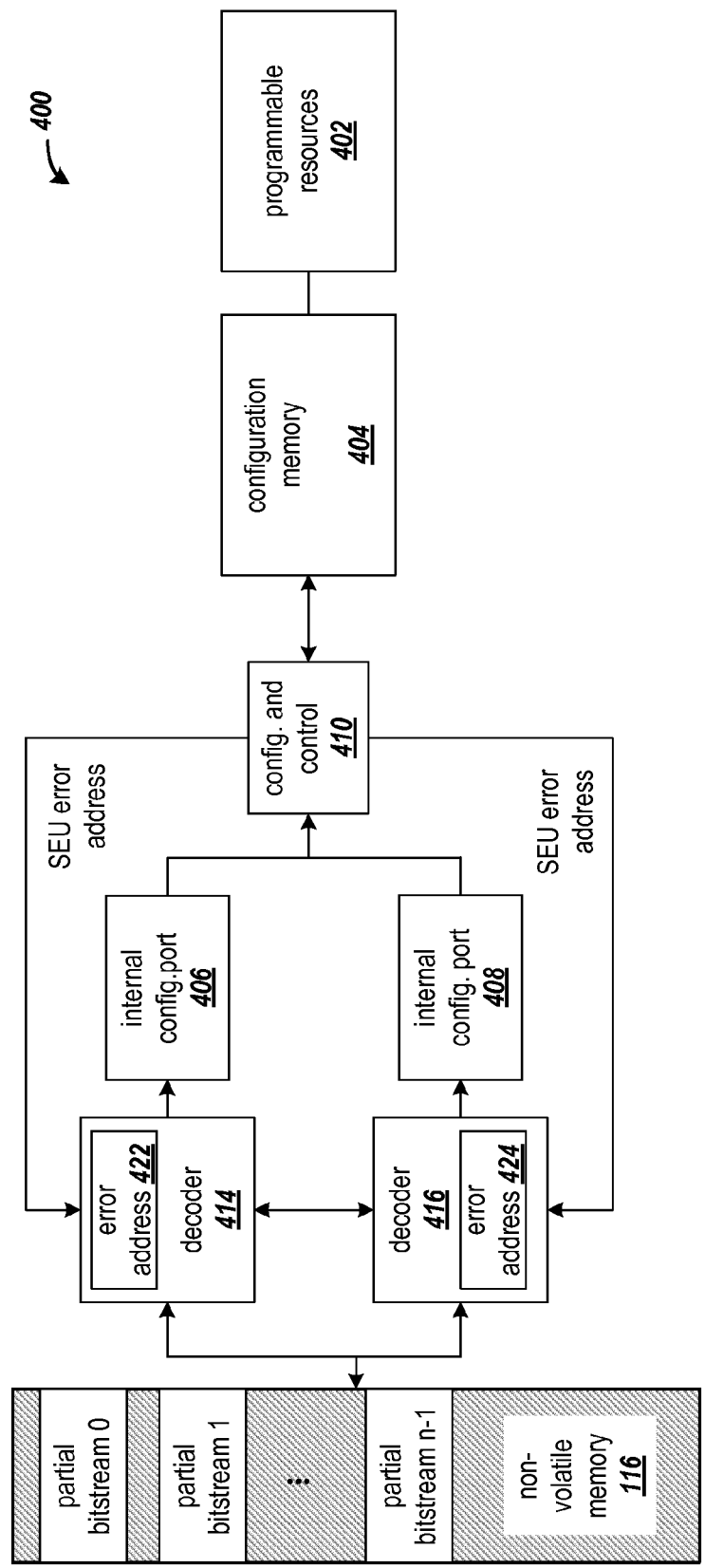
FIG. 4 shows a circuit arrangement for mitigating bit errors in accordance with another embodiment.

FIG. 4 shows a circuit arrangement for mitigating bit errors in accordance with another embodiment. Instead of a single decoder as presented in the embodiment of FIG. 1, circuit arrangement 400 includes two decoders 414 and 416. Each decoder is coupled to one of the internal configuration ports 406 and 408, respectively. The internal configuration ports are coupled to the configuration and control circuit 410, which is coupled to the configuration memory 404. The configuration and control circuit 410 is coupled to the programmable resources 402 and operates as described above in the embodiment of FIG. 1. Each SEU error address is transmitted to both decoder 414 and decoder 416. The decoders are coupled to the non-volatile memory 116.

Each of the decoders 414 and 416 has a respective error address register 422 and 424 for storing the SEU error address from the configuration and control circuit 410. Decoder 414 has access to both error address register 422 and to error address register 424, and decoder 416 has access to both error address register 424 and error address register 422. In response to the recently activated decoder detecting the same error address detected by the just-deactivated decoder, the entire bitstream may be reloaded.

The decoders 414 and 416 coordinate between being active and inactive as described in U.S. Pat. No. 8,099,625. Only one of the decoders is active at a time for initiating partial reconfiguration of the configuration memory 404. Likewise, only one of the internal configuration ports 406 and 408 is active for partially reconfiguring the configuration memory. The inactive decoder and internal configuration port are available for activation in the event that the active decoder and internal configuration port become impaired or inoperable.

The circuit arrangement 400 provides recovery from SEUs with double modular redundancy. Double modular redundancy is advantageous over triple modular redundancy implementations because logic is saved while providing the same level of protection. In response to the active decoder becoming corrupt, the inactive decoder becomes active and the corrupt decoder will be deactivated and no longer access the internal configuration port. The operation of the circuit arrangement 400 is described further in the process shown in FIG. 5.

Figure 5:
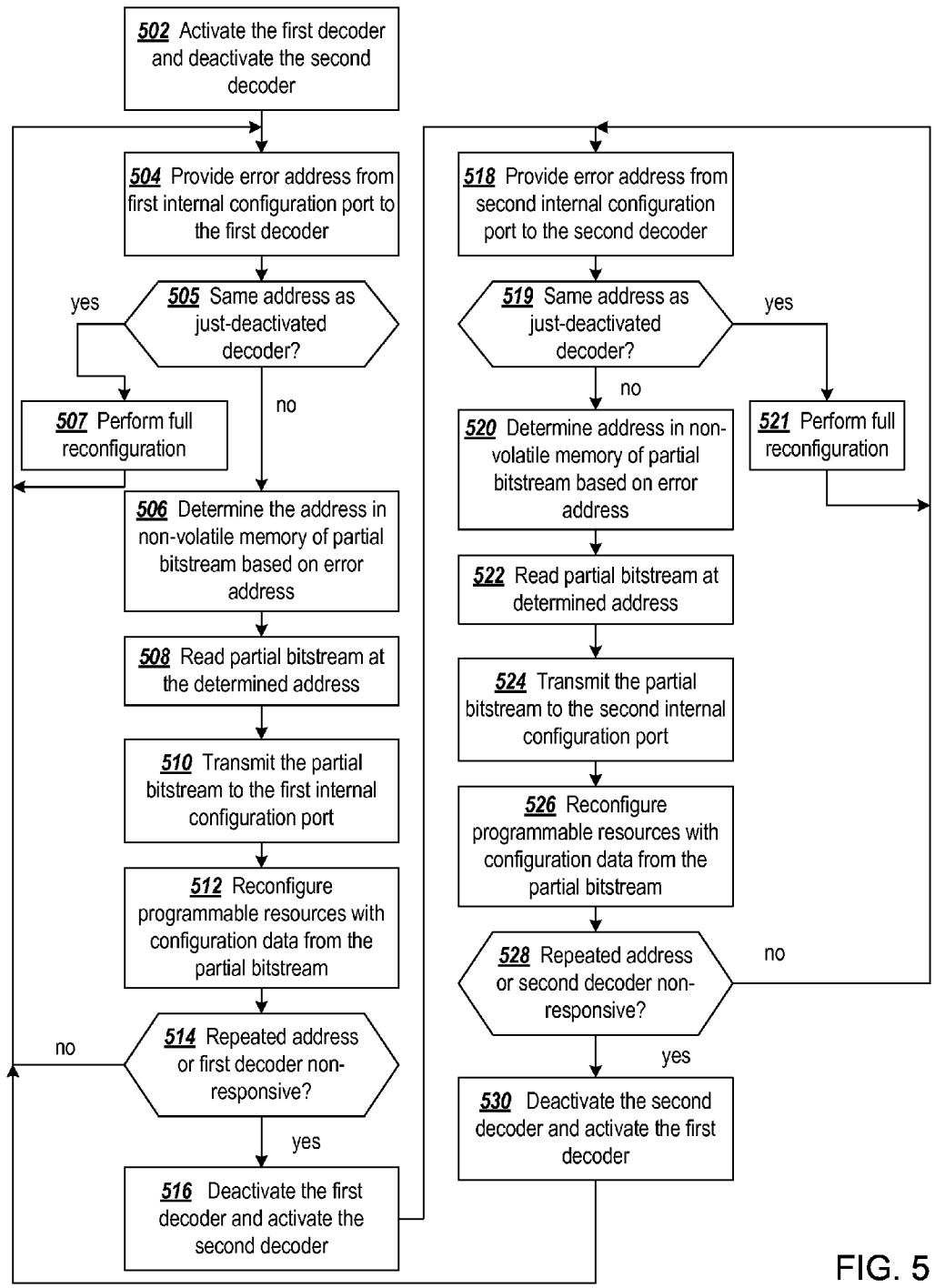
FIG. 5 is a flowchart of a process for mitigating bit errors in accordance with the circuit arrangement of FIG. 4.

FIG. 5 is a flowchart of a process for mitigating bit errors in accordance with the circuit arrangement of FIG. 4. At block 502, one of the decoders (e.g., 406) is activated, and the other decoder (e.g., 408) is deactivated. For ease of exposition, the initially active decoder is referred to as the first decoder and the initially inactive decoder is referred to as the second decoder. Similarly, the internal configuration port (e.g., 406) that is coupled to the active decoder is referred to the first internal configuration port, and the internal configuration port (e.g., 408) that is coupled to the inactive decoder is referred to the second internal configuration port.

In response to detecting a bit error calling for partial reconfiguration, the configuration and control circuit 410 provides the error address to the first decoder at block 504. In one embodiment, each decoder has access to the address of the other decoder. In response to the second decoder being deactivated and the error address being equal to the error address processed by the deactivated second decoder, decision step 505 directs the process to step 507. At block 507, a full reconfiguration of the configuration memory is performed. Thus, if the same error address is reported back-to-back to the first and second decoders, a full reconfiguration is performed. The process returns to block 504. If the error address is not the same as the error address just processed by the second decoder, the process continues at block 506.

In response to the error address, at block 506 the first decoder determines the address in the non-volatile memory of the partial bitstream needed to correct the errant bit. At block 508, the partial bitstream is read from the non-volatile memory at the computed address, and at block 510, the partial bitstream is transmitted to the first internal configuration port, and the first internal configuration port provides the partial bitstream to the configuration and control circuit 410. The configuration data from the partial bitstream is stored in the configuration memory for partially reconfiguring the programmable resources at block 512.

Decision block 514 checks whether or not the reported error address has been repeated a threshold number of times or whether the first decoder is non-responsive. If the address is not repeated and the first decoder has not become non-responsive, the process returns to block 504. Otherwise, the process continues at block 516. While not shown, it will be appreciated that the process counts the number of times an error is reported for each address. In addition, each decoder monitors the other decoder. In one embodiment, as described in U.S. Pat. No. 8,099,625, the decoders use a heartbeat circuit. At block 516, the first decoder is deactivated, and the second decoder is activated along with the second internal configuration port. The now-active second internal configuration port scans and reports addresses of bit errors to the second decoder as shown by block 518.

In response to the first decoder being deactivated and the error address being equal to the error address processed by the deactivated first decoder, decision step 519 directs the process to step 521. At block 521, a full reconfiguration of the configuration memory is performed. Thus, if the same error address is reported back-to-back to the first and second decoders, a full reconfiguration is performed. The process returns to block 518. If the error address is not the same as the error address just processed by the first decoder, the process continues at block 520.

In response to a reported error address, at block 520 the second decoder determines the address in the non-volatile memory of the partial bitstream to be used to correct the error. The partial bitstream is read at block 522, and at block 524 the partial bitstream is transmitted to the second internal configuration port. At block 526, the second internal configuration port partially reconfigures the configuration memory with the partial bitstream. At block 518 a subsequent error address may be reported to the second decoder by the second internal configuration port.

Decision block 528 checks whether or not the reported error address has been repeated a threshold number of times or the second decoder is non-responsive. If the address has not been repeated and the second decoder is responsive, the process returns to block 518. Otherwise, the process continues at block 530. While not shown, it will be appreciated that the process counts the number of times an error is reported for each address and monitors the second decoder for activity. At block 530, if either the address is repeated or the second decoder is non-responsive, then the second decoder is deactivated, and the first decoder is activated along with the first internal configuration port. The process then continues at block 504 as described above.

In another embodiment, the decoders 414 and 416 may alternate between being active and inactive with each successive SEU error address. For example, decoder 414 is initially active and processes the first SEU address; on the next SEU error address, decoder 414 is deactivated and decoder 416 is activated to process the error; on the next SEU error address, decoder 416 is deactivated and decoder 414 is activated, and so on.

Figure 6:
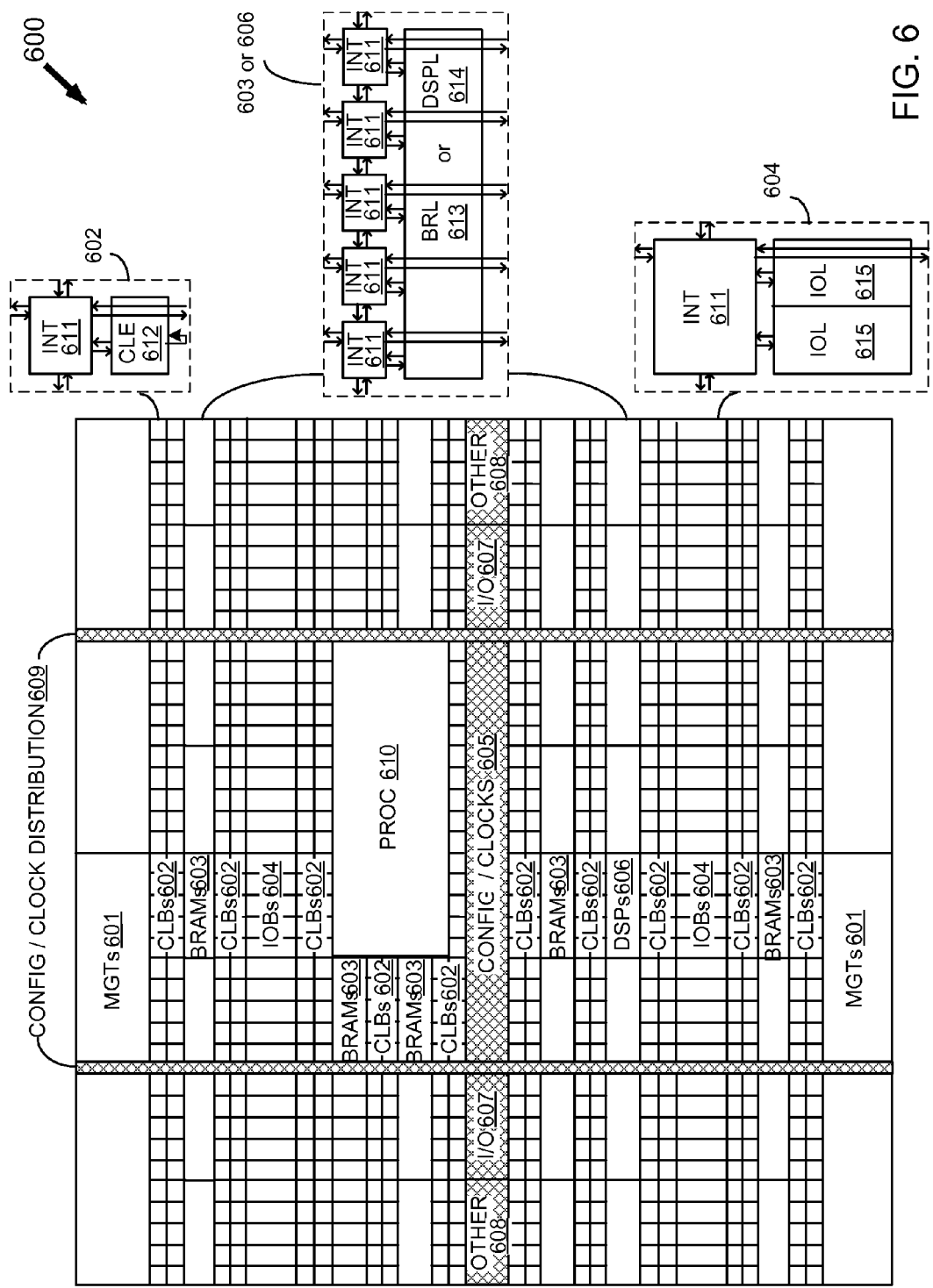
FIG. 6 is a block diagram of an example programmable logic integrated circuit that may be used in implementing error mitigation circuitry in accordance with various embodiments of the invention.

FIG. 6 is a block diagram of an example programmable logic integrated circuit that may be used in implementing error mitigation circuitry in accordance with various embodiments of the invention. FPGAs can include several different types of programmable logic blocks in the array. For example, FIG. 6 illustrates an FPGA architecture (600) that includes a large number of different programmable tiles including multi-gigabit transceivers (MGTs 601), configurable logic blocks (CLBs 602), random access memory blocks (BRAMs 603), input/output blocks (IOBs 604), configuration and clocking logic (CONFIG/CLOCKS 605), digital signal processing blocks (DSPs 606), specialized input/output blocks (I/O 607), for example, clock ports, and other programmable logic 608 such as digital clock managers, analog-to-digital converters, system monitoring logic, and so forth. Some FPGAs also include dedicated processor blocks (PROC 610) and internal and external reconfiguration ports (not shown). The CONFIG/CLOCKS 605 includes the internal configuration ports as described above.

In some FPGAs, each programmable tile includes a programmable interconnect element (INT 611) having standardized connections to and from a corresponding interconnect element in each adjacent tile. Therefore, the programmable interconnect elements taken together implement the programmable interconnect structure for the illustrated FPGA. The programmable interconnect element INT 611 also includes the connections to and from the programmable logic element within the same tile, as shown by the examples included at the top of FIG. 6.

For example, a CLB 602 can include a configurable logic element CLE 612 that can be programmed to implement user logic plus a single programmable interconnect element INT 611. A BRAM 603 can include a BRAM logic element (BRL 613) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 606 can include a DSP logic element (DSPL 614) in addition to an appropriate number of programmable interconnect elements. An IOB 604 can include, for example, two instances of an input/output logic element (IOL 615) in addition to one instance of the programmable interconnect element INT 611. As will be clear to those of skill in the art, the actual I/O pads connected, for example, to the I/O logic element 615 are manufactured using metal layered above the various illustrated logic blocks, and typically are not confined to the area of the input/output logic element 615.

In the pictured embodiment, a columnar area near the center of the die (shown shaded in FIG. 6) is used for configuration, clock, and other control logic. Horizontal areas 609 extending from this column are used to distribute the clocks and configuration signals across the breadth of the FPGA.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, the processor block PROC 610 shown in FIG. 6 spans several columns of CLBs and BRAMs.

Note that FIG. 6 is intended to illustrate only an exemplary FPGA architecture. The number of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual FPGA more than one adjacent column of CLBs is typically included wherever the CLBs appear, to facilitate the efficient implementation of user logic.

The embodiments are thought to be applicable to a variety of systems for mitigating the effects of errors in electronic circuits. Other aspects and embodiments will be apparent to those skilled in the art from consideration of the specification. The embodiments may be implemented as one or more processors configured to execute software, as an application specific integrated circuit (ASIC), or as a logic on a programmable logic device. It is intended that the specification and illustrated embodiments be considered as examples only, with a true scope of the invention being indicated by the following claims.

What is claimed is:

1. A method of mitigating single event upsets (SEUs) in a circuit arrangement, comprising:
   in response to each bit error of a plurality of bit errors, performing operations including:
      translating an error address indicative of the bit error in a configuration memory cell in the circuit arrangement into a non-volatile memory address;
      reading a partial bitstream at the non-volatile memory address in a non-volatile memory;
      alternately transmitting the partial bitstream to one of a first internal configuration port or a second internal configuration port of the circuit arrangement, wherein successive partial bitstreams read in response to successive ones of the bit errors are alternately transmitted to the first and second internal configuration ports; and
      reconfiguring a subset of configuration memory cells of the circuit arrangement, including the configuration memory cell referenced by the error address, with the partial bitstream.

2. The method of claim 1, wherein:
   each partial bitstream is n words; and
   the operations further include reading a first word of each partial bitstream in the non-volatile memory at an address offset that is a multiple of $2^{ceiling\ (log\ n)}$.

3. The method of claim 1, further comprising, in response to a threshold number of bit errors occurring over a threshold time period in one of the configuration memory cells, performing operations including:
   reading a plurality of partial bitstreams;
   alternately transmitting successive ones of the plurality of partial bitstreams to the first and second internal configuration ports; and
   reconfiguring configuration memory cells of the circuit arrangement with the plurality of partial bitstreams.

4. The method of claim 1, wherein the operations further include:
   activating one of the first and second internal configuration ports; and
   deactivating the other of the first and second internal configuration ports in response to a control word in each of the plurality of partial bitstreams.

5. The method of claim 1, wherein the reconfiguring the subset of configuration memory cells of the circuit arrangement includes reconfiguring configuration memory cells of a field programmable gate array.

6. The method of claim 1, wherein the operations further include:
   detecting each of the bit errors with circuitry that is disposed on an integrated circuit die with the configuration memory cells; and
   wherein the translating is performed by a circuit that is disposed on the integrated circuit die.

7. The method of claim 1, wherein the operations further include:
   detecting each of the bit errors with circuitry that is disposed on an integrated circuit die with the configuration memory cells; and
   wherein the translating is performed by a circuit that is not disposed on the integrated circuit die.

8. The method of claim 1, wherein the reading the partial bitstream includes reading the partial bitstream from the non-volatile memory that is disposed on an integrated circuit die other than an integrated circuit die on which the configuration memory cells are disposed.

9. The method of claim 1, wherein the reading the partial bitstream includes reading the partial bitstream from the non-volatile memory that is disposed on an integrated circuit die with the configuration memory cells.

10. A circuit arrangement, comprising:
    a configuration memory;
    programmable resources coupled to the configuration memory;
    a first internal configuration port coupled to the configuration memory;
    a second internal configuration port coupled to the configuration memory;
    a memory interface;
    a decoder circuit coupled to the first and second internal configuration ports and to the memory interface, wherein the decoder circuit is configured and arranged to, in response to each bit error of a plurality of bit errors:
       translate an error address indicative of the bit error in a configuration memory cell in the configuration memory into a non-volatile memory address;
       read a partial bitstream via the memory interface at the non-volatile memory address in a non-volatile memory; and
       transmit the partial bitstream to one of the first or second internal configuration ports, wherein successive partial bitstreams read in response to successive ones of the bit errors are alternately transmitted to the first and second internal configuration ports; and
    wherein each of the first and second internal configuration ports is configured and arranged to reconfigure a subset of configuration memory cells of the configuration memory, including the configuration memory cell referenced by the error address, in response to a partial bitstream received from the decoder.

11. The circuit arrangement of claim 10, wherein:
    each partial bitstream is n words; and
    the decoder circuit is further configured and arranged to read a first word of each partial bitstream in the non-volatile memory at an address offset that is a multiple of $2^{ceiling\ (log\ n)}$.

12. The circuit arrangement of claim 10, wherein the decoder is further configured and arranged, in response to a threshold number of bit errors occurring over a threshold time period in one of the configuration memory cells, to:
    read a plurality of partial bitstreams;
    alternately transmit successive ones of the plurality of partial bitstreams to the first and second internal configuration ports; and
    reconfigure configuration memory cells of the configuration memory with the plurality of partial bitstreams.

13. The circuit arrangement of claim 10, wherein each of the first and second internal configuration ports is configured and arranged to activate in response to a control word in each the plurality of partial bitstreams.

14. The circuit arrangement of claim 10, wherein the configuration memory, the programmable resources, and the first and second internal configuration ports comprise a field programmable gate array.

15. The circuit arrangement of claim 10, further comprising an error detection circuit coupled to the configuration memory, wherein:
  the error detection circuit is disposed on an integrated circuit die with the configuration memory; and
  the decoder is disposed on the integrated circuit die.

16. The circuit arrangement of claim 10, further comprising an error detection circuit coupled to the configuration memory, wherein:
  the error detection circuit is disposed on an integrated circuit die with the programmable resources; and
  the decoder is not disposed on the integrated circuit die.

17. The circuit arrangement of claim 10, wherein the non-volatile memory is disposed on an integrated circuit die other than an integrated circuit die on which the configuration memory is disposed.

18. The circuit arrangement of claim 10, wherein the non-volatile memory is disposed on an integrated circuit die with the configuration memory.

19. A method of mitigating single event upsets (SEUs) in a circuit arrangement, comprising:
  activating a first decoder and deactivating a second decoder in the circuit arrangement;
  in response the first decoder being active and in response to each bit error of a plurality of bit errors performing, by the first decoder, operations including:
    translating an error address indicative of the bit error in a configuration memory cell in the circuit arrangement into a non-volatile memory address;
    reading a partial bitstream at the non-volatile memory address in a non-volatile memory;
    transmitting the partial bitstream to a first internal configuration port of the circuit arrangement; and
    in response to detecting a threshold number of bit errors in one configuration memory cell, deactivating the first decoder and activating the second decoder;
  in response to the second decoder being active and in response to each bit error of a plurality of bit errors performing, by the second decoder, operations including:
    translating an error address indicative of the bit error in a configuration memory cell in the circuit arrangement into a non-volatile memory address;
    reading a partial bitstream at the non-volatile memory address in the non-volatile memory; and
    transmitting the partial bitstream to a second internal configuration port of the circuit arrangement; and
  reconfiguring a subset of configuration memory cells of the circuit arrangement, including the configuration memory cell referenced by the error address, with each partial bitstream.

20. The method of claim 19, further comprising in response to the second decoder being active and in response to detecting a threshold number of bit errors in one configuration memory cell, deactivating the second decoder and activating the first decoder.

\* \* \* \* \*